United States Patent
Han

(10) Patent No.: US 10,015,909 B1
(45) Date of Patent: Jul. 3, 2018

(54) FIXING DEVICE FOR INTERFACE CARD FLUID-COOLING STRUCTURE

(71) Applicant: EVGA CORPORATION, New Taipei (TW)

(72) Inventor: Tai-Sheng Han, New Taipei (TW)

(73) Assignee: EVGA CORPORATION, New Taipei (TW)

( * ) Notice: Subject to any disclaimer, the term of this patent is extended or adjusted under 35 U.S.C. 154(b) by 0 days.

(21) Appl. No.: 15/397,751

(22) Filed: Jan. 4, 2017

(51) Int. Cl.
*H05K 7/20* (2006.01)

(52) U.S. Cl.
CPC .......... *H05K 7/20272* (2013.01); *H05K 7/20* (2013.01); *H05K 7/2039* (2013.01); *H05K 7/20254* (2013.01); *H05K 7/20263* (2013.01); *H05K 7/20281* (2013.01)

(58) Field of Classification Search
None
See application file for complete search history.

(56) References Cited

U.S. PATENT DOCUMENTS

| | | | | |
|---|---|---|---|---|
| 5,646,824 A | * | 7/1997 | Ohashi | G06F 1/203 165/80.3 |
| 6,796,370 B1 | * | 9/2004 | Doll | F28F 3/048 165/168 |
| 2004/0008483 A1 | * | 1/2004 | Cheon | G06F 1/20 361/679.53 |
| 2006/0171801 A1 | * | 8/2006 | Manabe | F04D 13/0673 415/176 |

* cited by examiner

*Primary Examiner* — Dimary Lopez Cruz
*Assistant Examiner* — Zhengfu Feng
(74) *Attorney, Agent, or Firm* — Leong C. Lei

(57) ABSTRACT

A fixing device for a card fluid cooling structure of an interface includes: a water cooling device, adapted to cool an interface card; a cold drainage tube, configured on the water cooling device; a hot drainage tube, configured on the water cooling device and positioned at one side of the cold drainage tube; a first quick connector, configured on one end of the cold drainage tube far away from the water cooling device; a second quick connector, configured on one end of the hot drainage tube far away from the water cooling device; and a fixing structure, configured on one side of the interface card for the fixation of the hot and cold drainage tubes in position. Whereby, a user uses the fixing structure to fix the hot and cold drainage tubes in position, and the water cooling device can then be installed on the interface card conveniently.

4 Claims, 4 Drawing Sheets

FIXING DEVICE FOR INTERFACE CARD FLUID-COOLING STRUCTURE

(a) TECHNICAL FIELD OF THE INVENTION

The present invention relates to a fixing device for a fluid cooling structure of an interface card, and more particularly to a fixing device for a fluid cooling structure of an interface card, capable of the convenient assembly thereof on an interface card without making pipeline loose to cause water leak, and being in connection with other cooling devices quickly.

(b) DESCRIPTION OF THE PRIOR ART

Electronic elements such as interface cards generate a large amount of heat during working; the temperature thereof is always too high if they are not cooled in time, and the working efficiencies thereof is therefore decreased or they will even be damaged when worked under high temperature. To decrease the temperature of electronic elements, cooling devices may generally be configured on them, thereby speeding cooling. However, the current electronic devices are gradually reduced in volume such that it is not easy to install a number of cooling devices in a small space to cool electronic elements efficiently by means of hot and cold air convection. Therefore, water cooling devices are developed to cool electronic elements. Such kinds of devices include a water inlet pipe and drainage pipe; when the water cooling devices are working, cooling fluid is guided into the inlet pipe and guided out through the drainage pipe after absorbing the heat generated from electronic elements. Thereafter, the temperature of the cooling fluid absorbing the heat of electronic elements is lowered through a radiator and then flows back to the water cooling device to cool the electronic elements again and again, thereby achieving a cooling cycle of rapid heat exchange.

However, in the conventional water cooling devices mentioned above, the pipes may be pulled and dragged or connected incompletely upon assembly on interface cards such that they are easy to loose and leak water, and leaked water will cause the electric leakage or even damage of electronic elements. In addition, when more pipes need to be connected to a plurality of water cooling devices, it will further increase water leaking risk of pipes, being very inconvenient in use.

SUMMARY OF THE INVENTION

To overcome the defects mentioned above, the present invention is proposed.

The main object of the present invention is to provide a fixing device for a fluid cooling structure of an interface card, capable of using fluid to cool an interface card quickly through a water cooling device, heat drainage tube and cold drainage tube, allowing the stable operation of the interface card.

Another object of the present invention is to provide a fixing device for a fluid cooling structure of an interface card, capable of fixing the hot and cold drainage tubes in position through a fixing structure, preventing the tubes from loosing or leaking water because of human error upon assembly.

Still another object of the present invention is to provide a fixing device for a fluid-cooling structure of an interface card, capable of being connected with other water cooling devices or radiators through first and second quick connectors, being very convenient in use.

To achieve the objects mentioned above, the present invention proposes a fixing structure for a fluid cooling structure of an interface card, mainly includes a water cooling device configured on an interface card for the cooling of the interface card, a cold drainage tube allowing water with lower temperature to flow in the water cooling device is configure on the water cooling device, and a hot drainage tube allowing water with higher temperature after heat exchange to flow out thereof is configured thereon. More importantly, a first quick connector and second quick connector are respectively configured on ends of the hot and cold drainage tubes far away from the water cooling device, capable of being in connection with other water cooling devices or radiators quickly. Furthermore, a fixing device is configured on one side of the interface card for the fixation of the hot and cold drainage tubes in position. Thus, when a water cooling device is installed or a plurality of water cooling devices are connected to each other, the tubes are fixed and never loose even by pull and drag. In addition, using quick connectors can achieve convenient and safe effects.

DETAILED DESCRIPTION OF THE PREFERRED EMBODIMENTS

Figure 1:
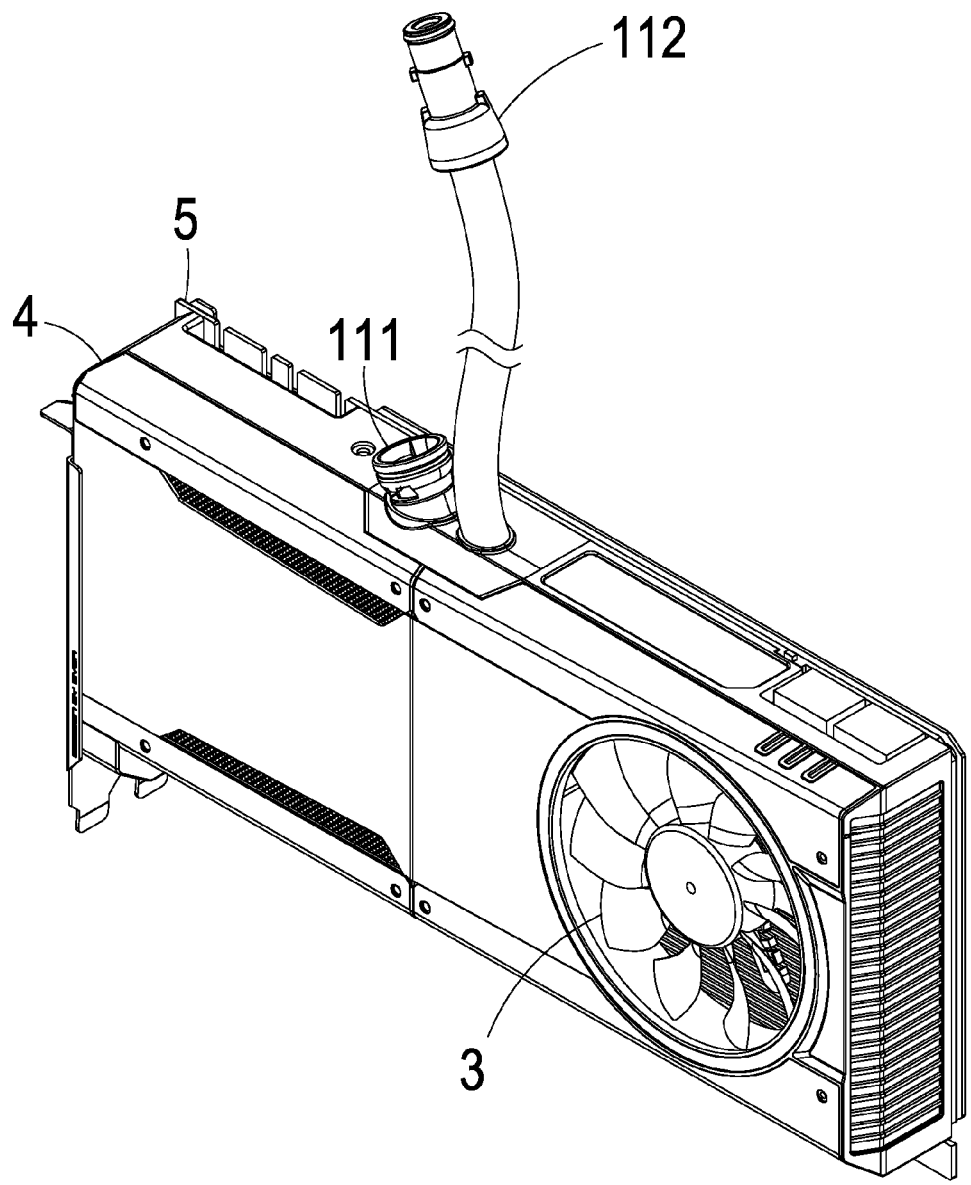
FIG. 1 is a perspective view of a preferred embodiment according to the present invention.
Figure 2:
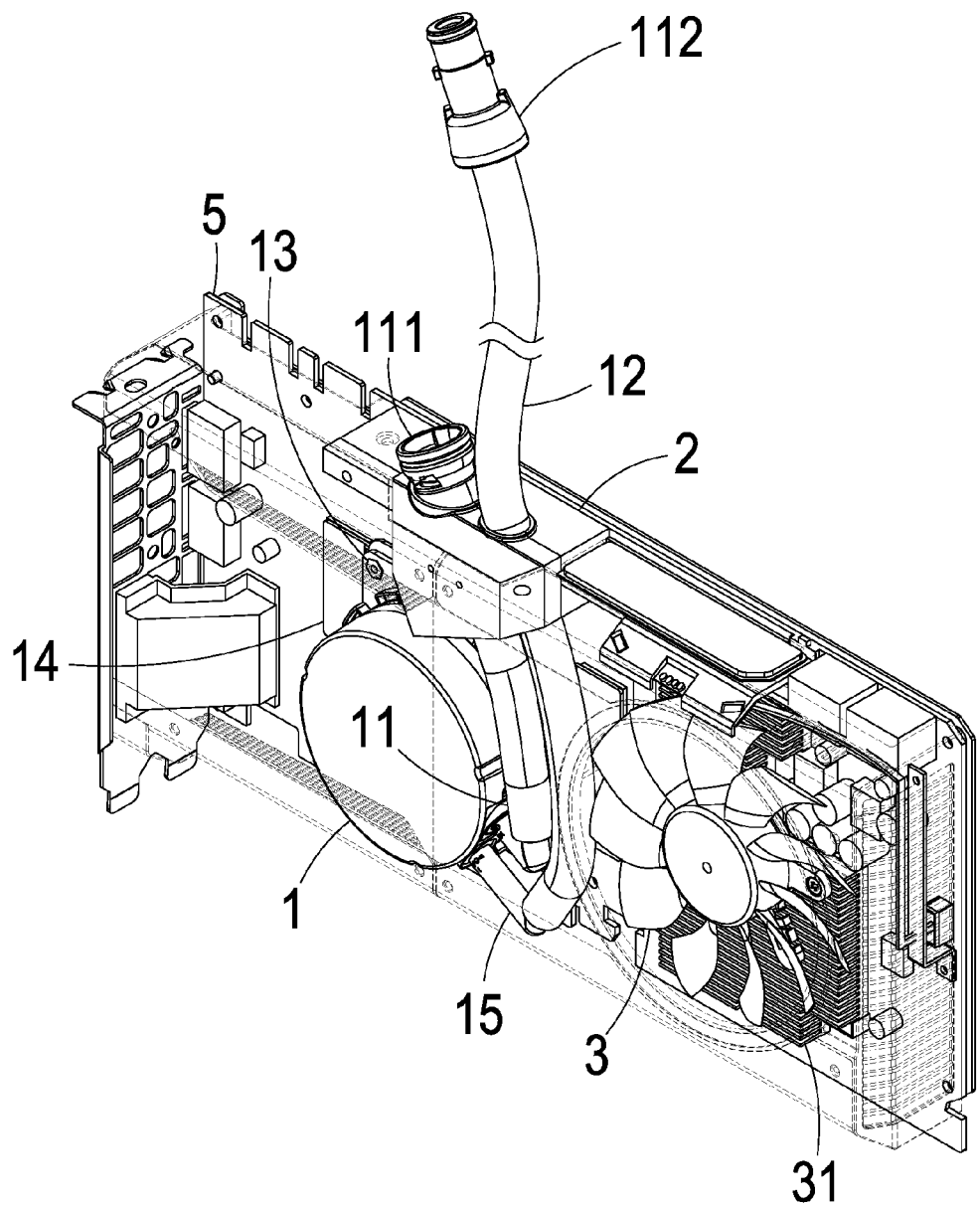
FIG. 2 is a perspective view of the embodiment according to the present invention when a housing is taken off.

Referring to FIGS. 1 and 2, which respectively are a perspective view and schematic view of a preferred embodiment according to the present invention, a fixing device for a fluid cooling structure of an interface card of the present invention includes: a water cooling device 1, configured on an interface card 5, and adapted to cool the interface card 5, at least one heat conducting sheet 14 configured between the water cooling device 1 and interface card 5, and a plurality of connection portions 13 on the water cooling device 1 for the coupling of the interface card 5 to it; a cold drainage tube 11, configured on the water cooling device 1, a quick connector 111 configured on one end of the cold drainage tube 11 far away from the water cooling device 1; a hot drainage tube 12, configured on the water cooling device 1 and positioned at one side of the cold drainage tube 11, a second quick connector 112 configured on one end of the hot drainage tube 12 far away from the water cooling device 1; a plurality of sealing combination parts 15, configured on the water cooling device 1 for the coupling of the hot drainage tube 12 and the cold drainage tube 11 to it; a fixing structure 2, configured on one side of the interface card 5 for the fixation of the hot and cold drainage tubes 12, 11 in position; a cooling fan 3, configured at one side of the water cooling device 1, at least one cooling fin 21 configured on the cooling fan 3; and a housing 4, configured on the water cooling device 1 and cooling fan 3.

Figure 3:
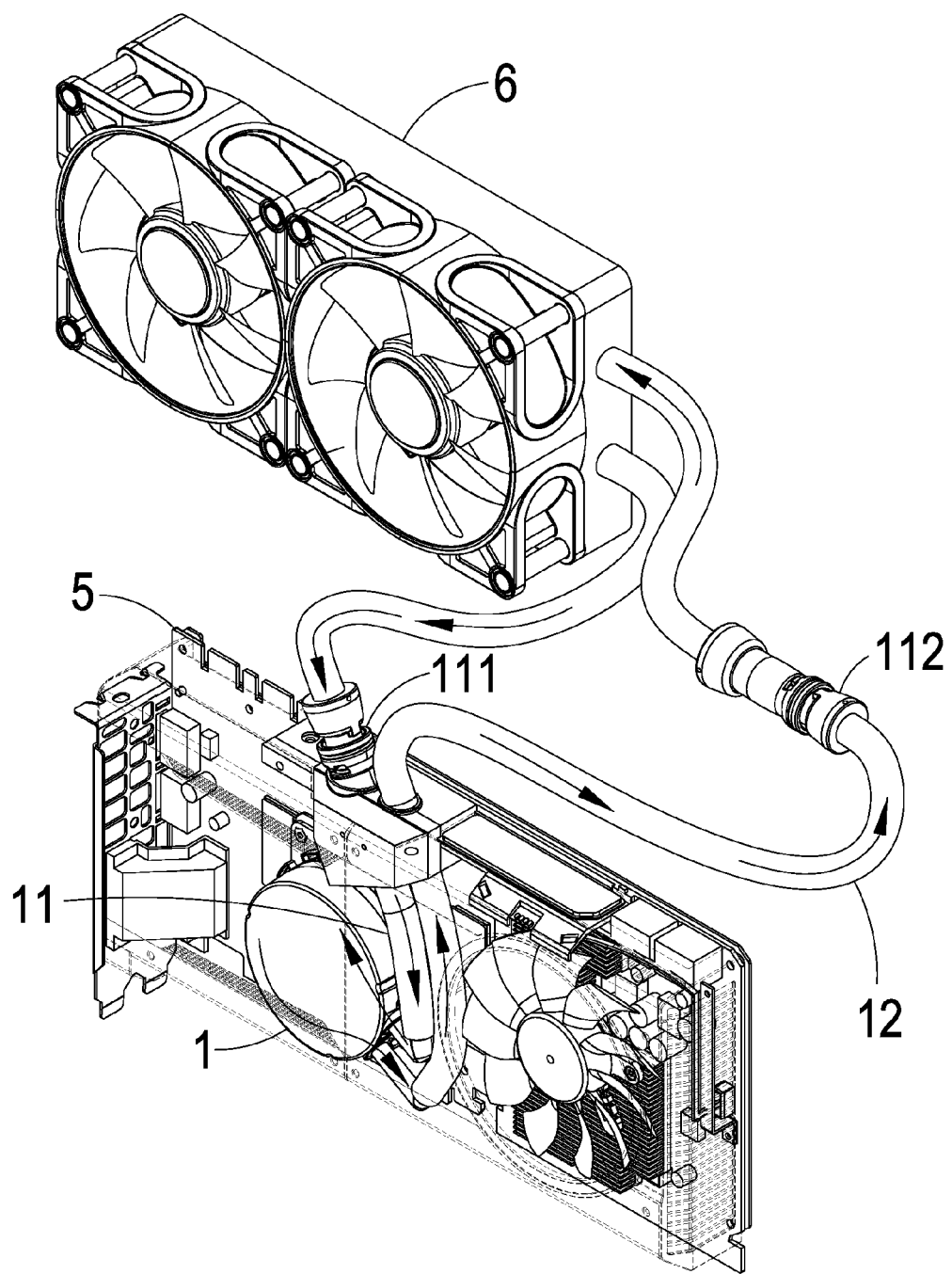
FIG. 3 is a perspective of the embodiment according to the present invention in an action state.

Referring to FIGS. 1 to 3, the water cooling device 1 is coupled to the interface card 5 through the connection portions 13, and heat generated from the interface card 5 can be transmitted quickly to the water cooling device 1 since the heat conducting sheet 14 is configured between the water cooling device 1 and interface card 5, where the water cooling device 1 is a water cooling pump, and cooling liquid is used to absorb the heat generated from the interface card 5, the cooling liquid generally being water since it is larger in specific heat, low in cost and easy to be obtained; the water with lower temperature flows in the water cooling device 1 through the cold drainage tube 11 and absorbs the heat of the interface card 5, and the water with higher temperature then flowing out thereof through the hot drainage tube 12 will pass through the radiator 6, where the temperature of the water here is decreased. Thereafter, the water flows back again to the water cooling device 1 to cool the interface card 5 once more, thereby achieving a cooling cycle of quick heat exchange. Furthermore, the cold drainage tube 11 and hot drainage tube 12 are fixed through the fixing structure 2, allowing the tubes not to loose to cause water leak and therefore to cause the damage or electric leakage of the interface card 5 or other electronic elements because of human error upon the installation of the water cooling device 1. In addition, the sealing combination parts 15 allows the cold drainage tube 11 and hot drainage tube 12 to be in tight combination with the water cooling device 1, further decreasing the risk of water leakage. Furthermore, the first quick connector 111 and second quick connector 112 being respectively configured on the cold drainage tube 11 and hot drainage tube 12 makes it possible to couple them quickly to the radiator 6 or other cooling devices 1. In addition, the cooling fan 3 and cooling fins 31 being configured at one side of the water cooling device 1 can enhance the effect of lowering the temperature of the interface card 5, allowing the normal operation of the interface card 5 without failure due to overheat, and the housing 4 can cover the tubes of the water cooling device 1 and cooling fan 3 for the protection thereof.

Figure 4:
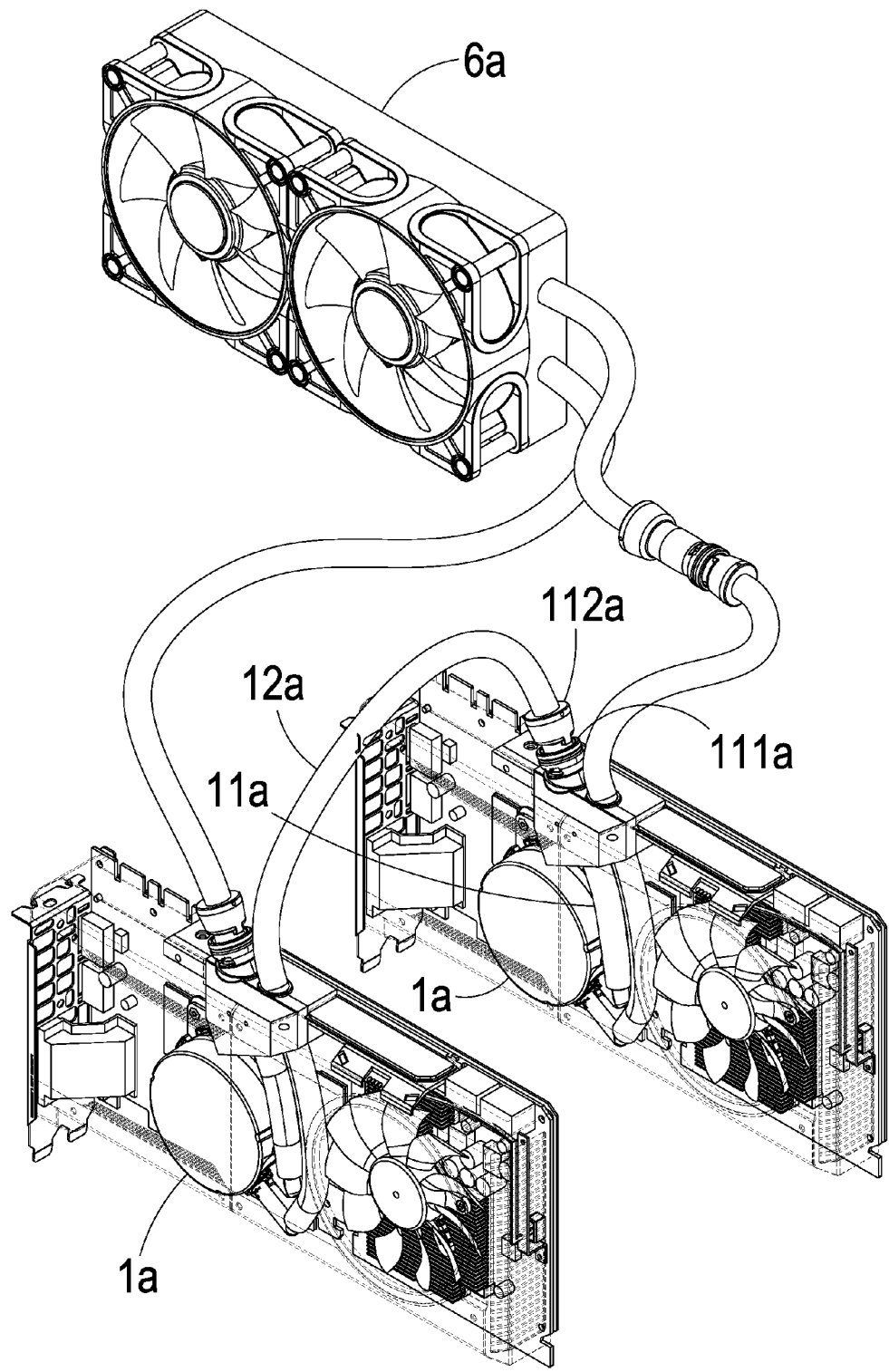
FIG. 4 is a perspective view of another preferred embodiment according to the present invention where water cooling devices are connected in series.

Referring to FIG. 4, which is a schematically perspective view of another preferred embodiment according to the present invention where water cooling devices are arranged in series, it can be seen clearly from the figure that a plurality of water cooling devices 1a may be installed if a plurality of interface cards need to be cooled, and the cold drainage tube 11a and hot drainage tube 12a are connected together through the first quick connectors 111a in combination with hot drainage connectors 112a, thereby allowing one water cooling device 1a to be in connection with another water cooling device 1a in series, and then in connection with a radiator 6a in series, which can save the installation space of the water cooling devices 1a and have the good appearance of the entirety.

Accordingly, the present invention has the following advantages compared to the prior art:

1. fluid can be used to cool the interface card 5 quickly through the designs of the water cooling device 1, hot drainage tube 12 and cold drainage tube 11, allowing the stable operation of the interface card 5.
2. the hot drainage tube 12 and cold drainage tube 11 can be fixed in position through the design of the fixing structure 2, preventing the tubes from loosing or water-leaking because of human error upon assembly.
3. the connection with other water cooling devices 1 or radiators 6 can be speeded up through the designs of the first quick connector 111 and second quick connector 112, being very convenient in use.

I claim:

1. A fixing device for a fluid cooling structure of an interface card, comprising:
    a water cooling device, adapted to cool the interface card;
    a cold drainage tube, configured on said water cooling device;
    a hot drainage tube, configured on said water cooling device and positioned at one side of said cold drainage tube;
    a first quick connector, configured on one end of said cold drainage tube far away from said water cooling device;
    a second quick connector, configured on one end of said hot drainage tube far away from said water cooling device; and
    a fixing structure configured on one side of said interface card for the fixation of said hot and cold drainage tubes in position;
    wherein at least one heat conducting sheet is configured on said water cooling device;
    wherein a plurality of connection portions are configured on said water cooling device for the coupling of said interface card thereto;
    wherein a cooling fan is configured at one side of said water cooling device;
    wherein at least one cooling fin is configured on said cooling fan; and
    wherein said fixing structure fixes said hot and cold drainage tubes to said interface card and said plurality of connection portions couple said water cooling device to said interface card so that said hot and cold drainage tubes and said cooling device are securely mounted to said interface card.

2. The fixing device according to claim 1, wherein a housing is configured on said water cooling device and cooling fan.

3. The fixing device according to claim 1, wherein a plurality of sealing combination parts are configured on said water cooling device, for the coupling of said hot drainage tube and cold drainage tube thereto.

4. The fixing device according to claim 1, wherein said water cooling device is a water cooling pump.

* * * * *